United States Patent
Binder et al.

(10) Patent No.: US 12,426,408 B2
(45) Date of Patent: Sep. 23, 2025

(54) OPTOELECTRONIC SEMICONDUCTOR COMPONENT

(71) Applicant: OSRAM Opto Semiconductors GmbH, Regensburg (DE)

(72) Inventors: Michael Binder, Barbing (DE); Andreas Rückerl, Konzell (DE); Roland Zeisel, Tegernheim (DE); Tobias Meyer, Kelheim (DE); Kerstin Neveling, Pentling (DE); Christine Rafael, Donaustauf (DE); Moses Richter, Regensburg (DE); Rainer Hartmann, Regensburg (DE); Clemens Vierheilig, Tegernheim (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 530 days.

(21) Appl. No.: 17/774,104

(22) PCT Filed: Nov. 3, 2020

(86) PCT No.: PCT/EP2020/080820
§ 371 (c)(1),
(2) Date: May 3, 2022

(87) PCT Pub. No.: WO2021/089545
PCT Pub. Date: May 14, 2021

(65) Prior Publication Data
US 2022/0393058 A1    Dec. 8, 2022

(30) Foreign Application Priority Data
Nov. 4, 2019   (DE) .................... 102019129619.6

(51) Int. Cl.
*H10H 20/00* (2025.01)
*H10H 20/84* (2025.01)

(52) U.S. Cl.
CPC .......... *H10H 20/052* (2025.01); *H10H 20/84* (2025.01)

(58) Field of Classification Search
CPC ... H01L 33/0033; H01L 33/44; H01L 27/156; H01L 33/32; H01L 33/382; H01L 33/145;
(Continued)

(56) References Cited

U.S. PATENT DOCUMENTS

| 11,309,459 B2 | 4/2022 | Vierheilig et al. |
| 2005/0029533 A1* | 2/2005 | Wu .................. H01L 33/32 438/22 |

(Continued)

FOREIGN PATENT DOCUMENTS

| WO | 2017112490 A1 | 6/2017 |
| WO | 2018192879 A1 | 10/2018 |
| WO | 2020258033 A1 | 12/2020 |

OTHER PUBLICATIONS

Chen, Y., "Picosun's ALD Technology Helps to Boost Micro LED Brightness," https://www.ledinside.com/press/2019/4/picosun_ald_technology_helps_boost_microled_brightness, Apr. 23, 2019, 1 page.

*Primary Examiner* — Syed I Gheyas
(74) *Attorney, Agent, or Firm* — Slater Matsil, LLP (57) ABSTRACT

In an embodiment, an optoelectronic semiconductor component includes a semiconductor layer sequence with a doped first layer, a doped second layer, an active zone configured to generate radiation by electroluminescence between the first layer and the second layer, and a side surface extending transversely to the active zone and delimiting the semiconductor layer sequence in a lateral direction, two electrodes for electrical contact between the first and second layers and a cover layer located on the side surface in a region of the first layer, wherein the cover layer is in direct contact with the first layer, wherein a material of the cover layer alone and its direct contact with the first layer are
(Continued)

configured to cause a formation of a depletion zone in the first layer, wherein the depletion zone comprises a lower concentration of majority charge carriers compared to a rest of the first layer, wherein the cover layer comprises a metal or a metal compound, and wherein the cover layer forms a Schottky contact with the first layer.

19 Claims, 11 Drawing Sheets

(58) Field of Classification Search
CPC .... H10H 20/052; H10H 20/84; H10H 20/825; H10H 20/8312; H10H 20/8162; H10H 29/142

See application file for complete search history.

(56) References Cited

U.S. PATENT DOCUMENTS

| | | | |
|---|---|---|---|
| 2011/0095332 A1* | 4/2011 | Hwang | H01L 33/44 257/E33.063 |
| 2015/0380461 A1* | 12/2015 | Robin | H01L 31/03529 257/459 |
| 2018/0062029 A1 | 3/2018 | Gomez-Iglesias et al. | |
| 2023/0155068 A1* | 5/2023 | Meng | H01L 33/145 257/88 |

* cited by examiner

OPTOELECTRONIC SEMICONDUCTOR COMPONENT

This patent application is a national phase filing under section 371 of PCT/EP2020/080820, filed Nov. 3, 2020, which claims the priority of German patent application 102019129619.6, filed Nov. 4, 2019, each of which is incorporated herein by reference in its entirety.

TECHNICAL FIELD

An optoelectronic semiconductor component is specified.

SUMMARY

Embodiments provide an optoelectronic semiconductor component which comprises a high efficiency especially at low current densities.

The optoelectronic semiconductor component may be an optoelectronic semiconductor chip, in particular an LED chip. The optoelectronic semiconductor component may be used, for example, in a headlight for a motor vehicle or in the background lighting in a mobile telephone or in a room lighting or as a (sub)pixel in a display.

According to at least one embodiment, the optoelectronic semiconductor component comprises a semiconductor layer sequence. The semiconductor layer sequence comprises a doped first layer, a doped second layer and an active zone for generating radiation by means of electroluminescence between the first layer and the second layer. Furthermore, the semiconductor layer sequence comprises at least one side surface extending transversely to the active zone, i.e. transversely to a main extension plane of the active zone. "Transverse" means, in particular, that the side surface is not parallel to the active zone. For example, the side surface and the active zone include an angle of at least 30° or at least 45° or at least 70° or of about 90° or of more than 90° with each other.

The side surface delimits the semiconductor layer sequence in a lateral direction, wherein a lateral direction is a direction parallel to the main extension plane of the active zone. The active zone is preferably adjacent to the side surface(s). The same preferably applies to the first and/or second layer. In particular, the side surface is formed of semiconductor material.

The semiconductor layer sequence is based, for example, on a III-V compound semiconductor material. The semiconductor material is, for example, a nitride compound semiconductor material, such as $Al_nIn_{1-n-m}Ga_mN$, or a phosphide compound semiconductor material, such as $Al_nIn_{1-n-m}Ga_mP$, or an arsenide compound semiconductor material, such as $Al_nIn_{1-n-m}Ga_mAs$ or $Al_nIn_{1-n-m}Ga_mAsP$, wherein $0 \leq n \leq 1$, $0 \leq m \leq 1$, and $m+n \leq 1$, respectively. Here, the semiconductor layer sequence may comprise dopants as well as additional components. For simplicity, however, only the essential constituents of the crystal lattice of the semiconductor layer sequence, i.e. Al, As, Ga, In, N or P, are specified, even if these may be partially replaced and/or supplemented by small amounts of additional substances. Preferably, the semiconductor layer sequence is based on AlInGaN or AlInGaP.

The active zone of the semiconductor layer sequence includes in particular at least one pn junction and/or at least one quantum well structure in the form of a single quantum well, SQW for short, or in the form of a multi-quantum well structure, MQW for short. The active zone may, for example, generate electromagnetic radiation in the blue or green or red spectral range or in the UV range or in the IR range during intended operation. The active zone comprises, for example, an average thickness, measured perpendicular to the main extension plane of the active zone, between 5 nm and 5000 nm, inclusive.

The first and second layers are semiconductor layers. The first and second layers comprise opposite dopants. For example, the first layer is n-doped and the second layer is p-doped or vice versa. Preferably, the first and second layers are adjacent to the active zone. For example, the first and/or second layers are each homogeneously doped within the manufacturing tolerance and/or are each homogeneously doped along their lateral extent.

Preferably, the semiconductor layer sequence comprises a plurality of side surfaces by which the semiconductor layer sequence is delimited in all lateral directions. For example, the semiconductor layer sequence comprises at least three or at least four side surfaces. Further preferably, in addition to the at least one side surface, the semiconductor layer sequence comprises a main emission surface through which at least 50% or at least 75% of the generated radiation is coupled out of the semiconductor layer sequence during operation of the semiconductor component. The main emission surface extends transversely or perpendicularly to the side surfaces. An edge length of the main emission area is, for example, at most 40 μm or at most 20 μm. The ratio of area to perimeter of the main emission surface is preferably at most 10 μm or at most 5 μm.

Here, a side surface is understood to mean both an outer surface of the semiconductor layer sequence which forms or marks one end of the semiconductor layer sequence and an inner surface of the semiconductor layer sequence which, for example, adjoins a recess and at which the semiconductor layer sequence is merely interrupted. Everything disclosed below for a side surface is also disclosed for all other side surfaces of the semiconductor component.

The semiconductor component may be a thin film chip. In this case, the growth substrate of the semiconductor layer sequence is remote from the semiconductor layer sequence.

According to at least one embodiment, the optoelectronic semiconductor component comprises two electrodes for electrical contact of the first and second layers. A first electrode—depending on the doping of the first layer, this is an n-electrode or a p-electrode—is used for contacting the first layer and a second electrode—depending on the doping of the second layer, this is a p-electrode or an n-electrode—is used for electrical contacting of the second layer. The electrodes are preferably ohmically conductive and are based on a different material system than the semiconductor layer sequence. For example, the electrodes are formed from one or more metals and/or from one or more transparent conductive oxides, TCO for short. Preferably, the electrodes are each in direct mechanical and electrical contact with the semiconductor layer sequence.

According to at least one embodiment, the optoelectronic semiconductor component comprises a cover layer on the side surface in the region of the first layer. The cover layer may be formed in one piece or be an integrally formed layer. Alternatively, the cover layer may comprise a plurality of partial layers which are stacked, for example, in the direction away from the side surface. Preferably, however, all partial layers of the cover layer are then based on the same class of material with regard to electrical conductivity. For example, all partial layers of the cover layer are either made of an electrically conductive material or of a dielectric (electrically insulating) material.

The cover layer is preferably a layer separate from the semiconductor layer sequence, which is applied to the side surface in particular only after the semiconductor layer sequence has grown and after the side surface has been formed. For example, the cover layer is then based on a different material than the first layer. In particular, an optically perceptible interface is then formed between the first layer and the cover layer.

Alternatively, it is also possible that the cover layer is part of the semiconductor layer sequence. For example, the cover layer is a doped region of the semiconductor layer sequence. In this case, the cover layer forms at least part of the side surface. In particular, the cover layer can then be based at least in sections on the same material as the first layer and/or the active zone and/or the second layer but comprise a different doping than the first layer.

For example, the cover layer comprises an average thickness of at least 5 nm or 10 nm or 20 nm or 50 nm. Alternatively or additionally, the average thickness of the cover layer is at most 1 µm or 500 nm or 250 nm. The thickness of the cover layer is measured perpendicular to the side surface.

The cover layer may cover or form the side surface, preferably several or each side surface of the semiconductor layer sequence, for the most part, for example at least 60% or at least 75% or at least 90% or completely.

According to at least one embodiment, the cover layer is in direct contact with the first layer. For example, the cover layer is directly or immediately applied to the first layer at the side surface. That is, the material of the cover layer is in direct mechanical contact with the semiconductor material of the first layer. If the semiconductor layer sequence comprises several side surfaces, the cover layer is preferably applied to or formed on several or all side surfaces and is in direct contact with the first layer in each case. The cover layer surrounds the semiconductor layer sequence or a section of the semiconductor layer sequence in the lateral direction, for example, at least 90% or completely. The cover layer is preferably formed continuously and without interruptions.

Furthermore, the cover layer may be applied directly to the active zone and/or to the second layer at the side surface.

According to at least one embodiment, the cover layer is made of such a material that the cover layer alone, in its direct contact with the first layer, causes the formation of a depletion zone in the first layer. The depletion zone is formed in particular at the boundary with the cover layer, i.e. in particular at the side surface. The depletion zone comprises a lower concentration of majority charge carriers compared to the rest of the first layer.

In other words, the mere presence of the cover layer in direct contact with the first layer ensures that there is a curvature of the conduction band and the valence band within the first layer, and this curvature is such that the majority charge carriers, i.e. electrons in the case of n-doping and holes in the case of p-doping, are repelled from the side surface.

The depletion zone comprises, for example, a mean width of at least 0.1 µm or 0.5 µm or 1 µm or 1.5 µm. Alternatively or additionally, the average width is at most 10 µm or 5 µm or 3 µm in each case. The width is the extent in a lateral direction away from the side surface. The depletion zone preferably completely surrounds a central region of the first layer in the lateral direction.

The average concentration of majority carriers within the depletion zone is preferably at most 80% or at most 60% or at most 40% of the average concentration of majority carriers outside the depletion zone in the rest of the first layer. The depletion zone is preferably present wherever the cover layer is adjacent to the first layer. The depletion zone, in turn, is then adjacent to the side surface in the region of the applied cover layer.

The fact that the cover layer alone in its direct contact with the first layer causes the formation of the depletion zone means in particular that the depletion zone is not generated by further layers or components of the semiconductor component. That is, if all components were removed from the semiconductor component, leaving only the semiconductor layer sequence and the cover layer at or on the side surface of the semiconductor layer sequence, the depletion zone would still be present within the first layer of the semiconductor layer sequence.

In at least one embodiment, the optoelectronic semiconductor component comprises a semiconductor layer sequence with a doped first layer, a doped second layer, an active zone for generating radiation by means of electroluminescence between the first layer and the second layer, and with a side surface extending across the active zone and delimiting the semiconductor layer sequence in a lateral direction. Further, the semiconductor component comprises two electrodes for electrically contacting the first and second layers and a cover layer on the side surface in the region of the first layer. The cover layer is in direct contact with the first layer. The cover layer is thereby of such a material that the cover layer alone in its direct contact to the first layer causes the formation of a depletion zone in the first layer, wherein the depletion zone comprises a lower concentration of majority charge carriers compared to the rest of the first layer.

Optoelectronic semiconductor components often exhibit undesirable phenomena at side surfaces (mesa edges). In particular, a parasitic diode can form on the side surfaces with a low insertion voltage. Due to this parasitic diode, non-radiative leakage current and/or preferential injection of charge carriers (especially at low currents) at the side surface into the active zone may occur. This has an influence on the efficiency of the semiconductor component. The influence is greater the larger the perimeter to area ratio of the semiconductor layer sequence.

Possibilities to reduce leakage currents at the mesa edge include electrically non-conductive passivation layers on the mesa edge to at least reduce surface recombination by saturating surface states. Another possibility is specified in international patent application WO 2018/192879 A1.

Embodiments provide a cover layer which is applied to or at least partially forms the side surface of the semiconductor layer sequence and which, by virtue of its material composition and direct contact with the first layer, causes a depletion zone in the latter in which the concentration of majority charge carriers is reduced. As a result, current flow along the side surface is suppressed and the efficiency of the semiconductor component can be increased.

According to at least one embodiment, the semiconductor component is configured to be operated with low current densities and/or in the low current regime. Preferably, an average current density in the active zone is at most 100 $A/cm^2$ or 50 $A/cm^2$ or 10 $A/cm^2$ or 1 $A/cm^2$.

According to at least one embodiment, the first layer is n-doped and the second layer is p-doped. This is the preferred case. However, a reverse doping is also conceivable. For example, an average doping concentration in the first and/or second layer is at least $0.5 \cdot 10^{17}$ $cm^{-3}$ or at least $5 \cdot 10^{17}$ $cm^{-3}$ or at least $1 \cdot 10^{18}$ $cm^{-3}$.

According to at least one embodiment, the work function for electrons in the cover layer is greater than in the first layer. For example, the work function in the cover layer is at least 4 eV or at least 4.5 eV. Preferably, the work function in the cover layer is at least 0.5 eV or at least 1 eV greater than in the first layer. In this context, the work function of a semiconductor material is understood to be the electron affinity of the semiconductor material.

According to at least one embodiment, the cover layer is electrically conductive. In particular, a resistivity of the cover layer for a current flow in a direction parallel to the side surface is at most $1 \cdot 10^8$ Ω·cm or at most $1 \cdot 10^4$ Ω·cm or at most 1 Ω·cm. The resistivity is specified at room temperature.

According to at least one embodiment, the cover layer comprises or consists of a metal or a metal compound. For example, the cover layer comprises or consists of one or more of Pt, Pd, Ti, Ni, NiAu, PtSi, Ir, TiN, TiWN, W. The cover layer may also comprise or consist of an electrically conductive oxide, such as $InO_2$, ZnO, ITO. The material of the cover layer may be amorphous or crystalline or polycrystalline.

Preferably, the cover layer comprises a reflectance of at least 70% or at least 85% for the electromagnetic radiation generated in the active zone. Alternatively or additionally, the cover layer preferably comprises an absorption coefficient for the electromagnetic radiation generated in the active zone of at most 20%.

According to at least one embodiment, the cover layer forms a Schottky contact with the first layer. The energy barrier for the transition of the majority charge carriers from the first layer to the cover layer is here, for example, at least 0.5 eV or at least 1 eV. The Schottky contact results firstly in the reduced majority carrier density at the side surface in the first layer and secondly in a low current flow from the semiconductor material into the cover layer, so that no shunt is formed through the cover layer.

According to at least one embodiment, the cover layer is formed of a doped semiconductor. Preferably, the cover layer is then doped with an opposite doping to that of the first layer. Thus, if the first layer is an n-doped layer, the cover layer is preferably p-doped. Preferably, the cover layer comprises a lower doping concentration than the first layer. For example, the doping concentration in the cover layer is at most 1/10 or at most 1/100 or at most 1/1000 of the doping concentration in the first layer.

According to at least one embodiment, the band gap in the cover layer is larger than in the first layer. For example, the band gap in the cover layer is larger than in the first layer by at least 0.2 eV or at least 0.4 eV. For example, the cover layer is formed of doped $SiO_x$, for example boron-doped $SiO_x$ (alpha-$SiO_x$:B).

The energy barrier for the transition from the majority charge carriers from the first layer to the cover layer is also at least 0.5 eV or at least 1 eV, for example, in the case of a cover layer made of semiconductor material.

Also by using such a semiconductor material as cover layer, the majority charge carrier density at the side surface is reduced and a current flow through the cover layer is reduced/prevented.

According to at least one embodiment, the cover layer is formed on the side surface at the level of the active zone. In particular, the cover layer covers the side surface at the level of the active zone. Viewed in plan view of the side surface(s), the active zone is, for example, partially or completely covered by the cover layer. In particular, the cover layer is applied directly to the active zone at the side surface.

According to at least one embodiment, the depletion zone extends to the active zone. For example, the depletion zone extends from the first layer into the active zone.

According to at least one embodiment, the semiconductor component comprises a doped third layer. The third layer comprises the same type of doping as the first layer. Thus, the first and third layers are either both n-doped or both p-doped but not oppositely doped. The third layer is also a semiconductor layer. The first and third layers can have identical structures except for the doping concentration. The third layer is also preferably homogeneously doped within the manufacturing tolerance.

According to at least one embodiment, the dopant concentration in the first layer is lower than in the third layer. For example, the dopant concentration in the first layer is lower than in the third layer by at least a factor of 10 or 100 or 1000. For example, an average dopant concentration in the third layer is at least $0.5 \cdot 10^{17}$ cm$^{-3}$ or at least $5 \cdot 10^{17}$ cm$^{-3}$ or at least $1 \cdot 10^{18}$ cm$^{-3}$.

For example, the first and third layers each comprise an average thickness of at least 0.05 μm or at least 0.1 μm or at least 0.5 μm or at least 1 μm. Alternatively or additionally, the average thicknesses of the first and third layers are each at most 5 μm or at most 2 μm or at most 1 μm. The first and third layers may each be adjacent to the side surface.

According to at least one embodiment, the first layer is arranged between the active zone and the third layer. For example, the first layer is adjacent to the active zone and/or the third layer.

In the region of the first layer, the cover layer is directly applied to or forms the side surface of the semiconductor layer sequence. For example, the side surface in the region of the third layer is free of the cover layer, i.e. not formed or covered by it. A lower dopant concentration in the first layer generally results in a wider depletion zone.

According to at least one embodiment, the second layer comprises a lower effective doping at the side surface than in the rest of the second layer. For example, an effective doping in the second layer at the side surface is lower than in the rest of the second layer by a factor of at least 10 or at least 100. The effective doping is the concentration of activated dopants, i.e., dopants that each provide a free charge carrier in the form of an electron or hole.

For example, if the semiconductor layer sequence is based on a nitride compound semiconductor material and the second layer is p-doped, in particular p-doped with Mg, the effective doping in the region of the side surface can be/is reduced by introducing hydrogen. Hydrogen compensates for the acceptors. The effective doping concentration becomes lower although the Mg concentration remains the same.

According to at least one embodiment, the cover layer is formed in the region of the second layer at the side surface, for example applied directly to the second layer. The cover layer covers, for example, as viewed in plan view of the side surfaces, both at least a portion of the first layer and a portion of the active zone as well as a portion of the second layer. Preferably, the cover layer extends continuously and without interruptions over or along the side surface.

For example, the cover layer is selected such that a depletion zone is also formed in the second layer, wherein a concentration of the majority charge carriers of the second layer is lower in the depletion zone than in the rest of the second layer.

According to at least one embodiment, a contact resistance between the cover layer and the second layer at the side surface is at least 100Ω or at least 1000Ω at least 10000Ω or at least 100000Ω. A high contact resistance may in particular be achieved by the second layer comprising a lower effective doping in the region of the side surface where the cover layer is adjacent to the second layer than in the rest of the second layer. High contact resistance in turn results in reduced current flow along the side surface.

According to at least one embodiment, the cover layer is electrically insulated from all electrodes of the semiconductor component. When operating the semiconductor component, the cover layer is preferably not connected to a voltage source. In particular, when operating the semiconductor component, the cover layer is at a different electrical potential than the n and p electrodes of the semiconductor component. For example, in operation, the cover layer is at a potential intermediate between that of the first electrode and that of the second electrode.

According to at least one embodiment, at least one recess is introduced into the semiconductor layer sequence and extends through the active zone. The recess is delimited by the side surface of the semiconductor layer sequence in the lateral direction. The recess may be a hole that is completely surrounded laterally by one or more side surfaces of the semiconductor layer sequence. Further, the recess may be a trench laterally delimited by two opposing side surfaces of the semiconductor layer sequence.

According to at least one embodiment, the cover layer is formed in the region of the recess on the side surface, in particular applied to the side surface. For example, the cover layer in the region of the recess completely covers the side surface. In this case, a cover layer may additionally be applied to side surfaces that form outer surfaces of the semiconductor component, or these side surfaces may be at least partially formed by the cover layer.

According to at least one embodiment, the semiconductor component comprises a plurality of individually and independently drivable pixels. Each pixel is preferably assigned a section of the semiconductor layer sequence, in particular uniquely assigned. Each section is surrounded and delimited in the lateral direction by one or more side surfaces of the semiconductor layer sequence. Preferably, each section of a pixel is completely surrounded and delimited in lateral direction by side surfaces of the semiconductor layer sequence. Each portion of the semiconductor layer sequence is preferably formed contiguously.

For example, the semiconductor layer sequence is applied to a carrier with integrated circuitry. Each pixel can then be assigned a transistor or switch of the carrier, via which the respective pixel can be switched on and off.

According to at least one embodiment, the sections of the semiconductor layer sequence are separated and spaced apart from each other by recesses in the semiconductor layer sequence. For example, the recesses form a grid of trenches, wherein a section of the semiconductor layer sequence is arranged in each mesh of the grid. For example, each section of the semiconductor layer sequence is rectangular when viewed from above.

According to at least one embodiment, the cover layer is formed around each section of the semiconductor layer sequence on the side surfaces, in particular applied to the side surfaces. In particular, the cover layer then leads to the formation in each section of the semiconductor layer sequence of a depletion zone as previously described, which, viewed in plan view, extends along the entire contour of the section of the semiconductor layer sequence.

According to at least one embodiment, the recess or the plurality of recesses are filled with an electrically conductive material. The electrically conductive material is then electrically insulated from the cover layer by a passivation layer, for example. The at least one recess preferably completely penetrates the first or the second layer and the active zone and opens into the second or the first layer. In the region of a bottom surface of the recess, the electrically conductive material is preferably in direct contact with the second or first layer. In particular, the at least one recess filled with the electrically conductive material forms a via.

According to at least one embodiment, the first layer or the second layer is electrically connected to one of the electrodes via the electrically conductive material. Preferably, the first and the second electrode are then arranged on the same side of the semiconductor layer sequence. For example, the optoelectronic semiconductor component is a thin film semiconductor chip.

BRIEF DESCRIPTION OF THE DRAWINGS

Further advantageous embodiments and further designs of the optoelectronic semiconductor component result from the exemplary embodiments described below in connection with the figures. Elements that are identical, of the same kind or have the same effect are provided with the same reference signs in the figures. The figures and the proportions of the elements shown in the figures are not to be regarded as to scale. Rather, individual elements, in particular layer thicknesses, may be shown exaggeratedly large for better illustration and/or understanding.

FIGS. 3 and 4 show schematic band structures.

DETAILED DESCRIPTION OF ILLUSTRATIVE EMBODIMENTS

Figure 1:
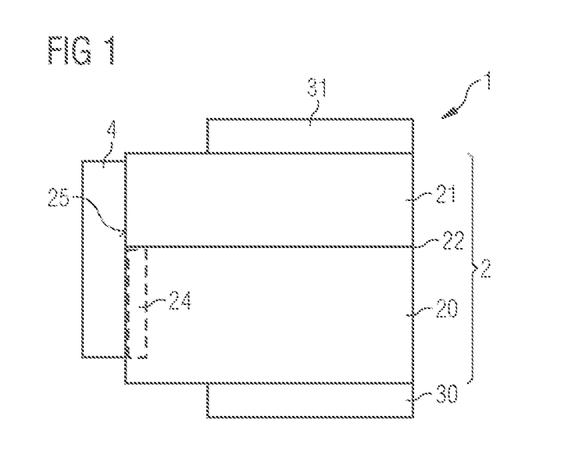
FIGS. 1, 2 and 4-20 show various exemplary embodiments of the optoelectronic semiconductor component in cross-sectional views and plan views.

FIG. 1 shows a first exemplary embodiment of an optoelectronic semiconductor component 1. A section of the semiconductor component 1 is shown here. The semiconductor component 1 is, for example, a thin-film semiconductor chip. The semiconductor component 1 comprises a semiconductor layer sequence 2 with a first layer 20, a second layer 21, and an active zone 22 between the first layer 20 and the second layer 21. The semiconductor layer sequence 2 is based, for example, on a III-V compound semiconductor material, such as AlInGaN.

The first layer 20 of the semiconductor layer sequence 2 is n-doped, for example, and the second layer 21 is correspondingly p-doped. But a reverse doping would also be conceivable. The active zone 22 is, for example, a pn junction.

The semiconductor component 1 further comprises electrodes 30, 31 for electrical contact of the semiconductor layer sequence 2. A first electrode 30 (n-electrode) is applied directly to the first layer 20 and is electrically conductively connected with the first layer 20. A second electrode 31 (p-electrode) is directly applied to the second layer 21 and is electrically conductively connected with the second layer 21. The electrodes 30, 31 comprise or consist, for example, of metal or a transparent conductive oxide, TCO for short.

A cover layer 4 is applied to a side surface 25 of the semiconductor layer sequence 2, which in the present case is an outer surface and laterally delimits the semiconductor layer sequence 2 and which extends transversely or perpendicularly to the active zone 22. The cover layer 4 is applied directly to the first layer 20, the active zone 22 and the second layer 21 at the side surface 25.

The cover layer 4 is formed of a material selected such that a depletion zone 24 is formed in the first layer 20 at the side surface 25 solely by the cover layer 4 and the direct contact with the first layer 20. In the depletion zone 24, the concentration of the majority charge carriers, in this case electrons, is lower than in the rest of the first layer 20.

Figure 2:
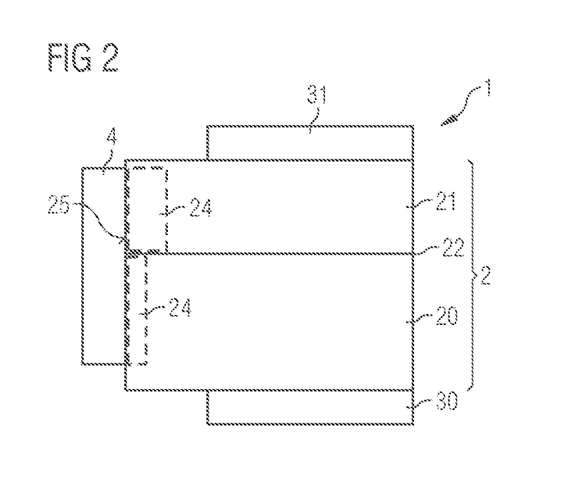

FIG. 2 shows a second exemplary embodiment of the semiconductor component 1. In contrast to the semiconductor component of FIG. 1, here the cover layer 4 is selected in such a way that solely through the cover layer 4 and the direct contact to the second layer 21, a depletion zone 24 is also formed in the second layer 21 at the side surface 25. The depletion zone 24 in the second layer 21 has a lower concentration of majority charge carriers, in this case holes, than the rest of the second layer 21.

Figure 3:
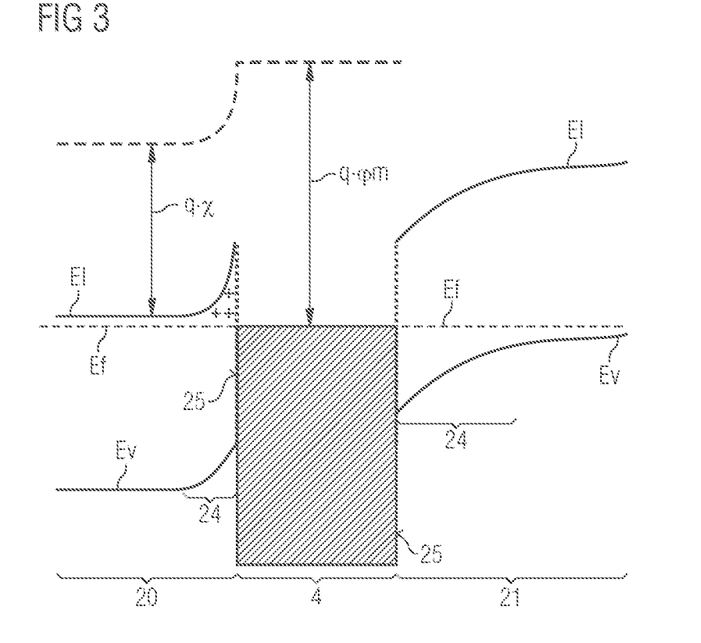

In FIG. 3, the band structures for the first layer 20, the cover layer 4, and the second layer 21 are shown in a diagram. For example, the band structures for the exemplary embodiment of FIG. 2 are shown. In the present case, the cover layer 4 is a layer made of a metal, for example Pt, Pd, Ti, Ni or NiAu.

The cover layer 4 comprises a work function $q \cdot \varphi m$ for electrons, which is higher than an electron affinity $q \cdot \chi$ in the first layer 20. Due to the direct contact of the cover layer 4 and the first layer 20, the Fermi energies Ef in the first layer 20 and the cover layer 4 equalize and a Schottky contact is formed. Both the conduction band El and the valence band Ev of the first layer 20 are bent. As a result, a potential barrier is formed for the electrons in the n-doped first layer 20, which blocks the electrons from entering the cover layer 4. Due to the bending of the conduction band El, the electrons in the first layer 20 are forced from the side surface 25 into the interior of the first layer 20. Thus, a depletion zone 24 is formed at the side surface 25 in the first layer 20.

It can also be seen that the direct contact of the cover layer 4 with the second layer 21 in the region of the side surface 25 creates a depletion zone 24 within the second layer 21, in which the concentration of holes is reduced compared to the rest of the second layer 21. This is again due to a curvature of the conduction band El and the valence band Ev of the second layer 21 at the side surface 25.

The depletion zones 24 in the layers 20, 21 at the side surface 25 suppress current flow along the side surface 25 and increase the efficiency of the semiconductor component 1.

Figure 4:
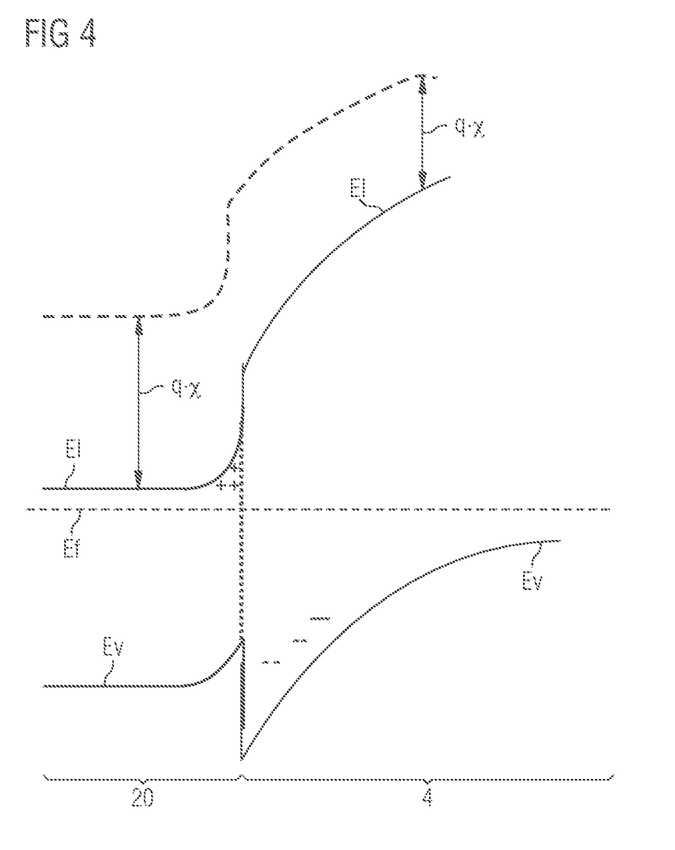

In FIG. 4, the band structures in the first layer 20 and the cover layer 4 are shown for the case where the cover layer 4 is formed of a semiconductor material. For example, the material of the cover layer 4 is p-doped silicon oxide, such as alpha-$SiO_x$:B. The band gap in the cover layer 4 is larger than in the first layer 20.

Figure 5:
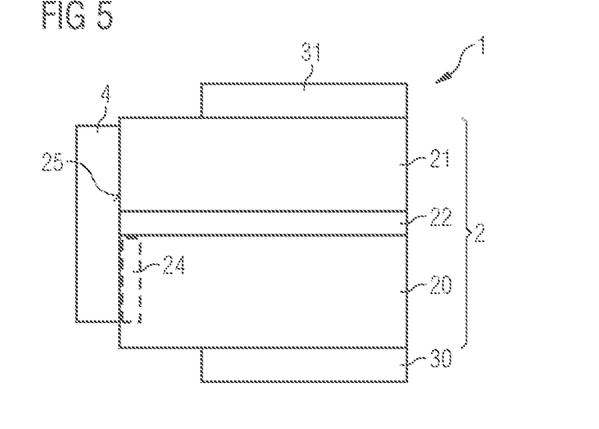

FIG. 5 shows an exemplary embodiment of the semiconductor component 1 in which the active zone 22 comprises, for example, a multi-quantum well structure.

Figure 6:
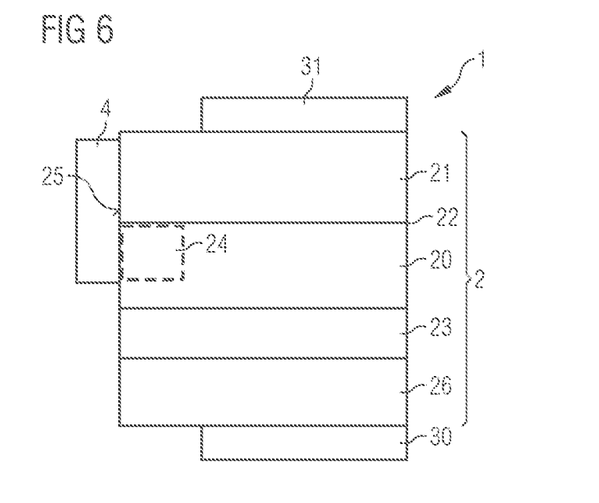

FIG. 6 shows an exemplary embodiment of the semiconductor component 1, in which the semiconductor component 1 comprises, in addition to the first layer 20, a third 23 and a fourth 26 layer, both of which are also n-doped. The first layer 20 is arranged between the third layer 23 and the active zone 22. In the first layer 20, the doping concentration is lower than in the third layer 23. The cover layer 4 is in direct contact with the first layer 20 at the side surface 25 but not with the third 23 and fourth 26 layers.

In the exemplary embodiment of FIG. 6, advantageously, the dopant concentration of the first layer 20 is lower than in other n-doped regions. As a result, the width of the depletion zone 24 is increased.

Figure 7:
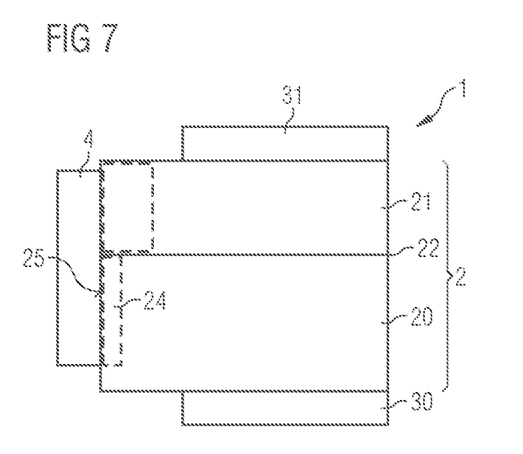

FIG. 7 shows another exemplary embodiment of the optoelectronic semiconductor component 1. Here, the second layer 21 comprises a lower effective doping at the side surface 25 than in the rest of the second layer 21. For example, the second layer is doped with magnesium and the effective doping is reduced at the side surface 25 due to a diffusion of hydrogen (deactivated acceptors). In this way, a contact resistance to the cover layer 4 is increased, which is further beneficial for reducing current flow along the side surface 25.

Figure 8:
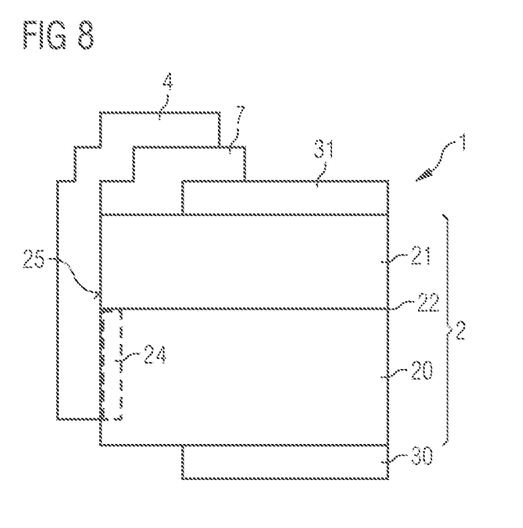

FIG. 8 shows an exemplary embodiment of the semiconductor component 1 in which the cover layer 4 is drawn from the side surface 25 to the second electrode 31. In this case, the cover layer 4 is electrically insulated from the second electrode 31 by a dielectric layer 7. The dielectric layer 7 is formed, for example, of silicon oxide or silicon nitride.

Figure 9:
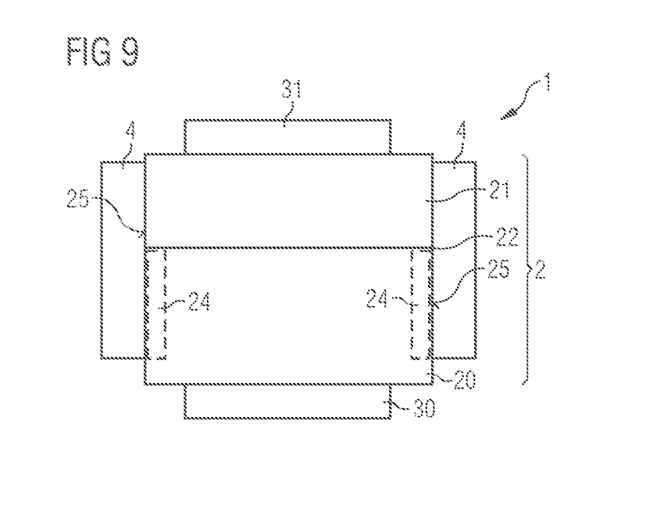
Figure 10:
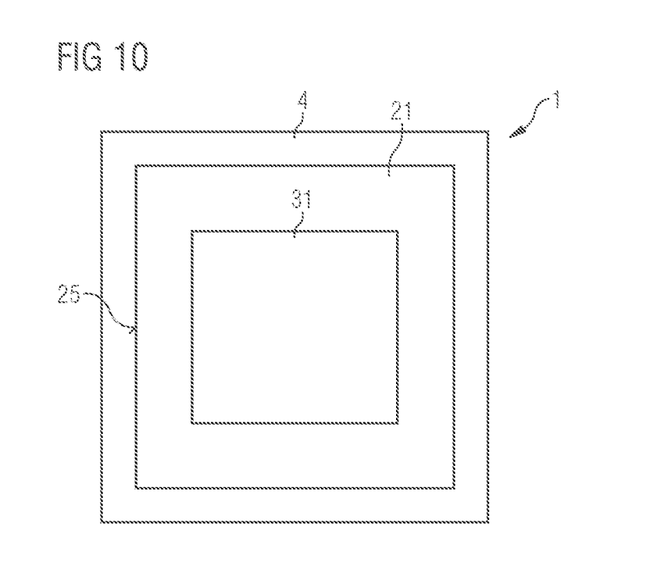

In FIGS. 9 and 10, the exemplary embodiment of the optoelectronic semiconductor component 1 of FIG. 1 is shown, but this time not only as a detail, but in the overall view. FIG. 9 is a cross-sectional view and FIG. 10 is a plan view. It can be seen that the cover layer 4 covers all side surfaces 25 of the semiconductor layer sequence 2. The cover layer 4 extends in lateral direction all around the semiconductor layer sequence 2 and is formed coherently and without interruptions. As a result, a depletion zone 24 is formed on all side surfaces 25 in the region of the first layer 20, which completely surrounds a central region of the first layer 20 laterally.

Figure 11:
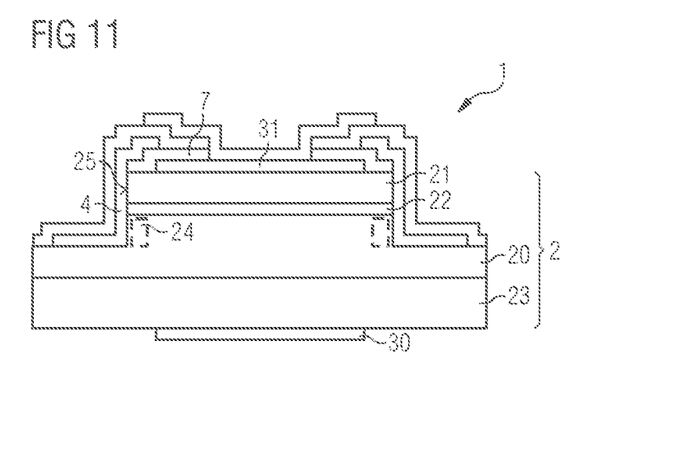

FIG. 11 shows a further exemplary embodiment of an optoelectronic semiconductor component 1. In particular, this is a semiconductor chip in which, for example, the growth substrate for the semiconductor layer sequence 2 is removed, the semiconductor layer sequence 2 is arranged between the first electrode 30 and the second electrode 31.

Figure 12:
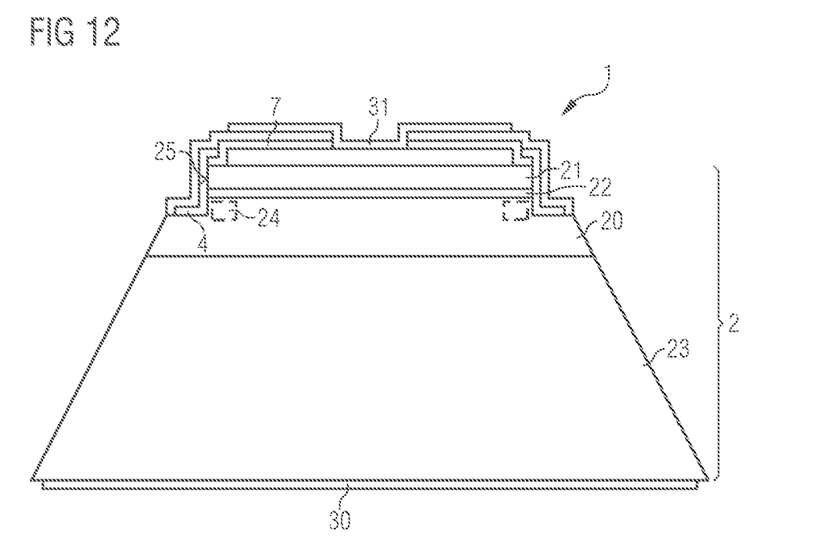

FIG. 12 shows still another exemplary embodiment of the semiconductor component 1 in the form of a semiconductor chip. Here, the third layer 23 widens in the direction away from the active zone 22.

Figure 13:
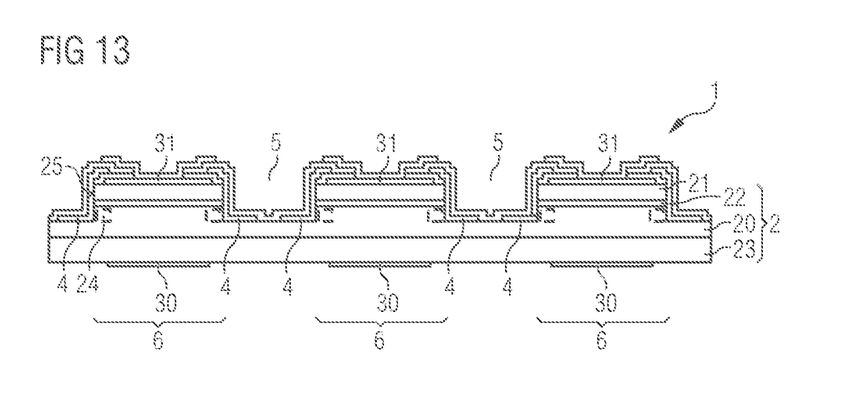
Figure 14:
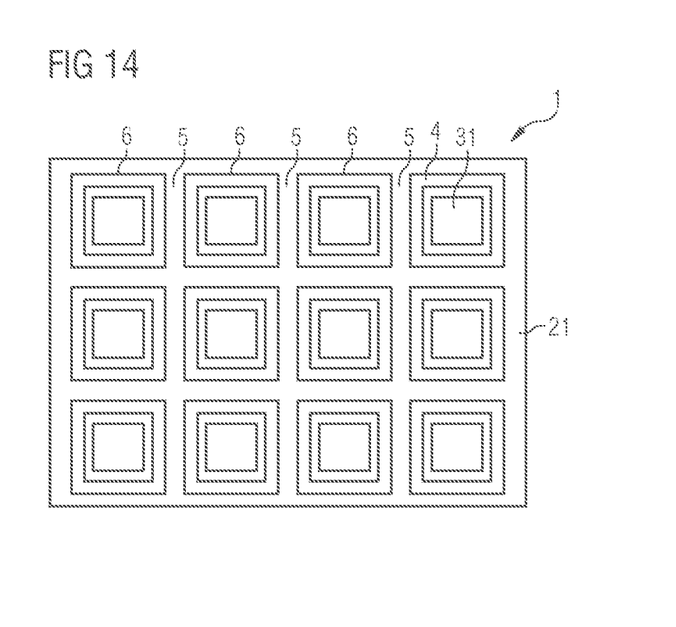

FIGS. 13 and 14 show an exemplary embodiment of a semiconductor component 1, in which the semiconductor component 1 is a pixelated semiconductor chip. FIG. 13 is a cross-sectional view and FIG. 14 is a plan view. The semiconductor layer sequence 2 is segmented into several island-shaped sections by recesses 5 in the form of trenches which together form a rectangular grid. Each of these sections is uniquely associated with a pixel 6 of the semiconductor component 1. Furthermore, each pixel 6 is uniquely assigned its own first electrode 30 and its own second electrode 31 for contacting the section of the semiconductor layer sequence 2. The pixels 6 can thus be electrically driven individually and independently of one another and emit electromagnetic radiation individually and independently of one another during operation. However, instead of individual first electrodes 30 or second electrodes 31 for each pixel 6, all pixels 6 may share a common first electrode 30 or a common second electrode 31.

It can be seen that the recesses 5 are delimited in the lateral direction by side surfaces 25 of the sections of the semiconductor layer sequence 2. A cover layer 4 is applied to each of these side surfaces 25 in the region of the recesses 5. As a result, depletion zones 24 are formed in each section of the semiconductor layer sequence 2 in the region of the first layer 20 at the side surfaces 25.

Figure 15:
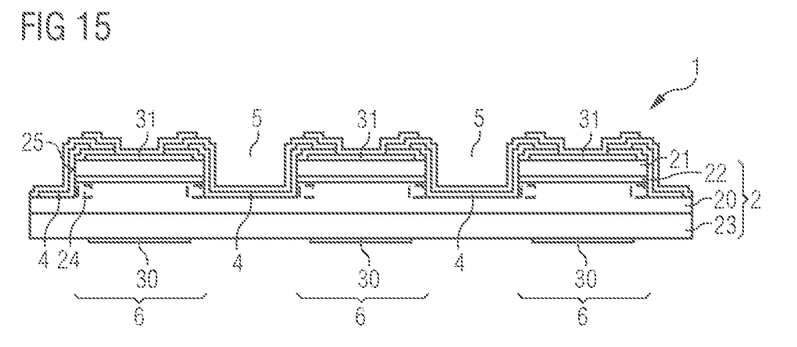
Figure 16:
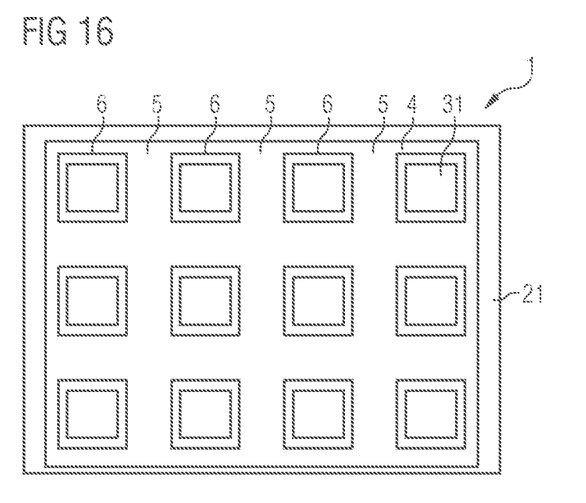

FIGS. 15 and 16 essentially show the exemplary embodiment of FIGS. 13 and 14. In FIGS. 13 and 14, each pixel 6 is uniquely assigned its own cover layer 4. The cover layer 4 of different pixels 6 are separated and spaced apart from each other. In FIGS. 15 and 16, on the other hand, the cover layers 4 of all pixels 6 are contiguous. In other words, a single, contiguous cover layer 4 is used here, covering all side surfaces 25 of all pixels 6.

Figure 17:
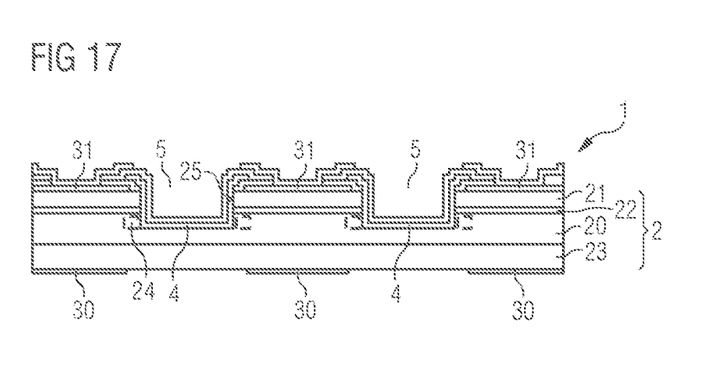

FIGS. 17 (cross-sectional view) and 18 (plan view) show another exemplary embodiment of the semiconductor component 1, in which recesses 5 are again introduced into the semiconductor layer sequence 2. Here, however, the recesses 5 are not trenches but holes in the semiconductor layer sequence 2, each recess 5 being completely surrounded by the semiconductor layer sequence 2 in the lateral direction. In this case, although the recesses 5 penetrate the active zone 22 as in the preceding exemplary embodiments, the active zone 22 is still formed contiguously and is not segmented as in FIGS. 13 to 16.

Figure 18:
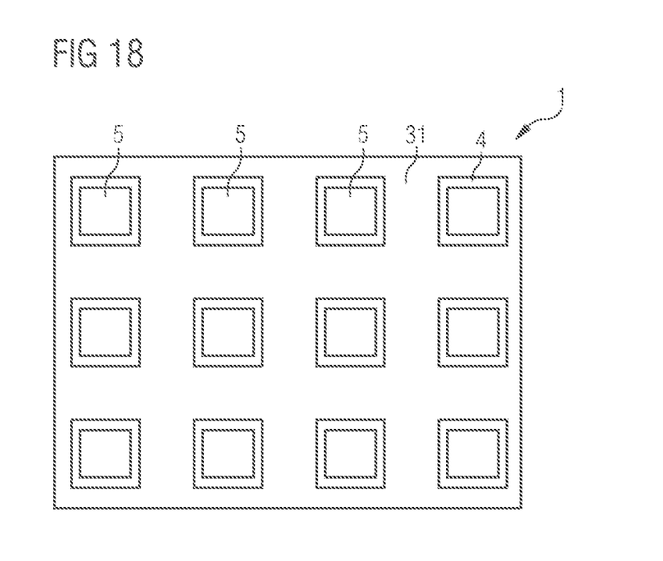

Furthermore, the semiconductor component 1 of FIGS. 17 and 18 comprises only a second electrode 31, which is formed contiguously, and is breached by the recesses 5 in regions. The cover layer 4 is again applied to the side surfaces 25 of the semiconductor layer sequence 2 in the recesses 5, where it provides for the formation of the depletion zones 24.

Figure 19:
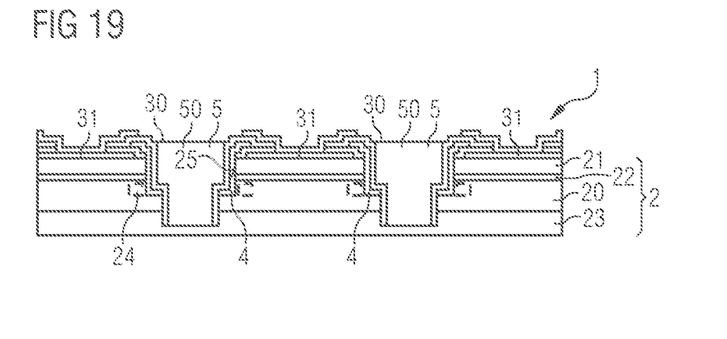
Figure 20:
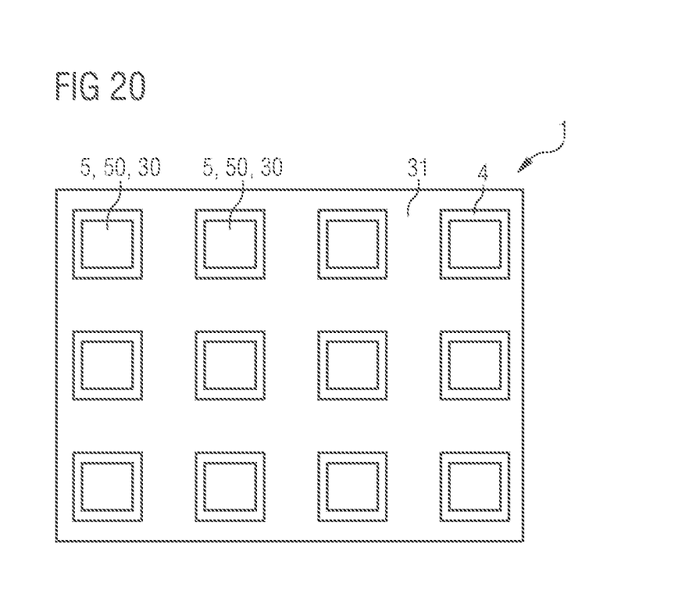

FIGS. 19 and 20 show an exemplary embodiment of the semiconductor component 1 in which the electrodes 30, 31 are arranged on the same side of the semiconductor layer sequence 2. Here, recesses 5 in the form of holes penetrate the second layer 21 and the active zone 22 and open into the third layer 23. Within the recesses 5, the cover layer 4 is again applied to the side surfaces 25 of the semiconductor layer sequence 2 and provides for the formation of the depletion zones 24. A dielectric layer is applied to the sides of the cover layer 4 facing away from the side surfaces 25. The recesses 5 are further filled with an electrically conductive material 50, for example a metal. The dielectric layers within the recesses 5 provide electrical insulation between the electrically conductive material 50 and the cover layers 4. In the region of bottom surfaces of the recesses 5, the electrically conductive material 50 is in direct contact with the third layer 23. The filled recesses 5 thus form vias for electrical contact of the semiconductor layer sequence 2.

The invention is not limited to the exemplary embodiments by the description thereof. Rather, the invention encompasses any new feature as well as any combination of features, which in particular includes any combination of features in the patent claims, even if these features or this combination itself is not explicitly specified in the patent claims or exemplary embodiments.

The invention claimed is:

1. An optoelectronic semiconductor component comprising:
   a semiconductor layer sequence with a doped first layer, a doped second layer, an active zone configured to generate radiation by electroluminescence between the first layer and the second layer, and a side surface extending transversely to the active zone and delimiting the semiconductor layer sequence in a lateral direction;
   two electrodes for electrical contact between the first and second layers; and
   a cover layer formed in one piece and located on the side surface in a region of the first layer,
   wherein the cover layer is in direct contact with a portion of the first layer, a portion of the active zone and a portion of the second layer,
   wherein a material of the cover layer alone is configured to cause a formation of a depletion zone in the first layer,
   wherein the depletion zone comprises a lower concentration of majority charge carriers in comparison with a rest of the first layer,
   wherein the cover layer comprises a metal or a metal compound, and
   wherein the cover layer forms a Schottky contact with the first layer.

2. The optoelectronic semiconductor component according to claim 1,
   wherein the first layer is n-doped and the second layer is p-doped, and
   wherein a work function for electrons in the cover layer is greater than a work function for electrons in the first layer.

3. The optoelectronic semiconductor component according to claim 1, wherein the cover layer is electrically conductive.

4. The optoelectronic semiconductor component according to claim 1,
   wherein the cover layer is located on the side surface at a level of the active zone, and
   wherein the depletion zone extends up to the active zone.

5. The optoelectronic semiconductor component according to claim 1, further comprising:
   a doped, third layer comprising the same type of doping as the first layer,
   wherein a doping concentration in the first layer is lower than a doping concentration in the third layer, and
   wherein the first layer is arranged between the active zone and the third layer.

6. The optoelectronic semiconductor component according to claim 1, wherein the second layer comprises a lower effective doping at the side surface than in a rest of the second layer.

7. The optoelectronic semiconductor component according to claim 1,
   wherein the cover layer is located in a region of the second layer on the side surface, and
   wherein a contact resistance of at least 100 Q is present between the second layer and the cover layer.

8. The optoelectronic semiconductor component according to claim 1, wherein the cover layer is electrically insulated from all electrodes of the optoelectronic semiconductor component.

9. The optoelectronic semiconductor component according to claim 1,
   wherein at least one recess is located in the semiconductor layer sequence, the recess extending through the active zone and being delimited by the side surface in the lateral direction, and
   wherein the cover layer is located in a region of the recess on the side surface.

10. The optoelectronic semiconductor component according to claim 9, further comprising:
    a plurality of individually and independently drivable pixels,
    wherein each pixel is associated with a section of the semiconductor layer sequence,
    wherein each section is surrounded and delimited in the lateral direction by one or more side surfaces,
    wherein the sections of the semiconductor layer sequence are separated by recesses and are spaced apart from one another, and
    wherein the cover layer is located around each section of the semiconductor layer sequence at the side surfaces.

11. The optoelectronic semiconductor component according to claim 9,
  wherein the recess is filled with an electrically conductive material, and
  wherein the first layer or the second layer is electrically connected to one of the electrodes via the electrically conductive material.

12. An optoelectronic semiconductor component comprising:
  a semiconductor layer sequence with a doped first layer, a doped second layer, an active zone configured to generate radiation by electroluminescence between the first layer and the second layer, and a side surface extending transversely to the active zone and delimiting the semiconductor layer sequence in a lateral direction;
  two electrodes for electrical contact between the first and second layers; and
  a cover layer formed in one piece and located on the side surface in a region of the first layer,
  wherein the cover layer is in direct contact with a portion of the first layer, a portion of the active zone and a portion of the second layer,
  wherein a material of the cover layer alone is configured to cause a formation of a depletion zone in the first layer,
  wherein the depletion zone comprises a lower concentration of majority charge carriers compared to a rest of the first layer,
  wherein the first layer is n-doped and the second layer is p-doped, and
  wherein a work function for electrons in the cover layer is greater than a work function for electrons in the first layer.

13. The optoelectronic semiconductor component according to claim 12, wherein the cover layer is electrically insulated from all electrodes of the optoelectronic semiconductor component.

14. The optoelectronic semiconductor component according to claim 12, wherein the cover layer is formed of a doped semiconductor.

15. An optoelectronic semiconductor component comprising:
  a semiconductor layer sequence with a doped first layer, a doped second layer, an active zone configured to generate radiation by electroluminescence between the first layer and the second layer, and a side surface extending transversely to the active zone and delimiting the semiconductor layer sequence in a lateral direction;
  two electrodes for electrical contact between the first and second layers; and
  a cover layer formed in one piece and located on the side surface in a region of the first layer,
  wherein the cover layer is in direct contact with a portion of the first layer, a portion of the active zone and a portion of the second layer,
  wherein a material of the cover layer alone is configured to cause a formation of a depletion zone in the first layer,
  wherein the depletion zone comprises a lower concentration of majority charge carriers compared to a rest of the first layer, and
  wherein the second layer comprises a lower effective doping at the side surface than in a rest of the second layer.

16. The optoelectronic semiconductor component according to claim 15, wherein the cover layer is formed of a doped semiconductor.

17. The optoelectronic semiconductor component according to claim 16, wherein a bandgap in the cover layer is larger than a bandgap in the first layer.

18. The optoelectronic semiconductor component according to claim 15, wherein a bandgap in the cover layer is larger than a bandgap in the first layer.

19. The optoelectronic semiconductor component according to claim 15, wherein the cover layer is electrically insulated from all electrodes of the optoelectronic semiconductor component.

* * * * *

UNITED STATES PATENT AND TRADEMARK OFFICE
CERTIFICATE OF CORRECTION

| | | |
|---|---|---|
| PATENT NO. | : 12,426,408 B2 | Page 1 of 1 |
| APPLICATION NO. | : 17/774104 | |
| DATED | : September 23, 2025 | |
| INVENTOR(S) | : Michael Binder et al. | |

It is certified that error appears in the above-identified patent and that said Letters Patent is hereby corrected as shown below:

In the Claims

In Column 12, Line 39, Claim 7:
Change "wherein a contact resistance of at least 100 Q is present"
To --wherein a contact resistance of at least 100 Ω is present--

Signed and Sealed this
Fourth Day of November, 2025

John A. Squires
*Director of the United States Patent and Trademark Office*